United States Patent [19]

Zoltán

[11] Patent Number: 4,857,827
[45] Date of Patent: Aug. 15, 1989

[54] ELECTRONIC LOAD FOR TESTING TRANSFORMERS

[75] Inventor: István Zoltán, Budapest, Hungary

[73] Assignee: Tettex AG, Zurich, Switzerland

[21] Appl. No.: 35,055

[22] Filed: Apr. 6, 1987

[30] Foreign Application Priority Data

Apr. 4, 1986 [DE] Fed. Rep. of Germany ....... 3611261

[51] Int. Cl.$^4$ ............................................. G01R 31/00
[52] U.S. Cl. ....................................... 324/55; 323/357
[58] Field of Search ......................... 324/55, 547, 127; 361/35; 330/165; 323/205, 212, 215, 356, 357

[56] References Cited

U.S. PATENT DOCUMENTS

| | | | |
|---|---|---|---|
| 3,497,793 | 2/1970 | Gasparini et al. | 324/127 |
| 3,701,008 | 10/1972 | Kusters et al. | 324/55 |
| 4,739,248 | 4/1988 | Perkins | 324/55 |

FOREIGN PATENT DOCUMENTS

| | | | |
|---|---|---|---|
| 0214216 | 10/1984 | Fed. Rep. of Germany | 324/55 |
| 0181188 | 12/1984 | Hungary | 324/55 |
| 0040659 | 3/1982 | Japan | 324/55 |

OTHER PUBLICATIONS

Bradley et al, Transient Compensation of Current Transformers, Jul./Aug. 1978, IEEE Trans. on Power Apparatus and Systems, vol. PAS-97, No. 4.
IEC Standard (International Electrotechnical Commission), Publ. #185; 1st Edition, 1966; Bureau Central de la Commission Electrotechnique Internationale.
American National Standard (ANS), Dec. 29, 1978; ANSI/IEEE; C57.13-1978.

*Primary Examiner*—Reinhard J. Eisenzopf
*Assistant Examiner*—Jack B. Harvey
*Attorney, Agent, or Firm*—Frishauf, Holtz, Goodman & Woodward

[57] ABSTRACT

An adjustable electronic load for testing current transformers and/or voltage transformers, the load having connected, between its input current terminals, a series connection including the input of a current-to-voltage converter and the output of a controlled generator, and having connected, between its input voltage terminals, the input of a voltage-to-voltage converter. The outputs of the current-to-voltage converter and the voltage-to-voltage converter are each connected via an impedance to a control input of the controlled generator. The voltage-to-voltage converter and the current-to-voltage converter each comprise at least one amplifier with adjustable amplification. The amplifications of the two adjustable amplifiers are adjustable jointly in opposite directions. In the case of a load for testing a current transformer, with the rated secondary power of the current transformer being predetermined, the amplification of the current-to-voltage converter is reduced or increased and the amplification of the voltage-to-voltage converter is increased or reduced respectively, so as to increase or reduce the rated secondary current, respectively. In the case of a load for testing a voltage transformer, with the rated secondary power of the voltage transformer being predetermined, the amplification of the voltage-to-voltage converter is reduced or increased and the amplification of the current-to-voltage converter is increased or reduced respectively, so as to increase or reduce the rated secondary voltage, respectively.

18 Claims, 4 Drawing Sheets

ELECTRONIC LOAD FOR TESTING TRANSFORMERS

BACKGROUND OF THE INVENTION

Electronic loads are used for testing and calibrating current transformers and voltage transformers, for which the collective term "measuring transformer" is generally used. Such transformers will be termed measuring transformers hereinafter. Tests are made on measuring transformers with different rated powers, rated currents and rated voltages, respectively. The loads connected thereto during testing serve to measure the errors of the measuring transformers when these transformers are subjected to loads. Due to the fact that it is necessary on the one hand to test various measuring transformers having different nominal or rated powers, currents and voltages, and since it is necessary on the other hand to measure one and the same measuring transformer at different loads, it is thus required to have correspondingly different load values to properly test the transformers.

Passive loads that are made up of passive impedance elements are known. A disadvantage of passive loads is that the impedances of the lines and of the testing or calibration instrument distort the value of the loads. It is therefore necessary to have as many types of loads as there are types of testing or calibration instruments and lines or leads. An additional disadvantage of passive loads is that they contain manually operated power current switches, which renders remote control and programming impossible. This prevents fully automatic testing of measuring transformers.

Hungarian Patent Specification No. 181,188 discloses an electronic load which is adjustable. The known electronic load of Hungarian Patent Specification No. 181,188 can be adapted to different requirements by adjustment of the impedances present between the current-to-voltage converter, the voltage-to-voltage converter and the control input of the controlled voltage or current generator, respectively. The line impedances as well as the impedances of the testing or calibration instrument are rendered ineffective by the control loops contained in this electronic load.

The rated power and the rated secondary currents and voltages, respectively, of measuring transformers are standardized. Besides, there are test specifications according to which a measuring transformer having a specific rated power must be tested at this rated power and, furthermore, at various fractions of this rated power.

With the electronic load known from said Hungarian Patent Specification, only the impedance may be adjusted. This means that a specific rated secondary power of the measuring transformer can be obtained only with one specific rated secondary current or one specific rated secondary voltage, respectively.

It is the object of the present invention to improve the known electronic load in such a manner that, with the rated power being predetermined by the impedance, the rated secondary current or the rated secondary voltage, respectively, can be selected in addition, without alteration of the impedance adjustment.

SUMMARY OF THE INVENTION

According to the present invention, an adjustable electronic load for use in testing current transformers, comprises input voltage terminals ($U_1$, $U_2$) and input current terminals ($I_1$, $I_2$) adapted to be coupled to a transformer to be tested; current-to-voltage converter means ($K_U$) having an input coupled between input voltage terminals ($U_1$, $U_2$) of the electronic load, and further having an output; and controlled voltage generator means (G) having a control input and an output. A series connection of said input of said current-to-voltage converter means ($K_I$) and said output of said controlled voltage generator (G) is connected between input current terminals ($I_1$, $I_2$) of the electronic load. First impedance means ($Z\beta$) is provided for coupling the output of said current-to-voltage converter means ($K_I$) to said control input of said controlled voltage generator means (G); and second impedance means (R) is provided for coupling the output of said voltage-to-voltage converter means ($K_U$) to said control input of said controlled voltage generator means (G); said voltage-to-voltage converter means ($K_U$) and said current-to-voltage converter means ($K_I$) each comprising at least one respective adjustable amplifier having an adjustable amplification factor. An adjusting means is coupled to said adjustable amplifiers of said voltage-to-voltage converter means ($K_U$) and of said current-to-voltage converter means ($K_I$) for adjusting said amplification factors of said adjustable amplifiers jointly in opposite directions such that the amplification factor of one of said adjustable amplifiers increases while the amplification factor of the other of said adjustable amplifiers decreases and vice versa, so that with a given rated secondary power of a current transformer being tested, the amplification of said current-to-voltage converter means ($K_I$) is decreased and the amplification of said voltage-to-voltage converter means ($K_U$) is increased for increasing the rated secondary current of a current transformer being tested, and the amplification of the voltage-to-voltage converter means ($K_U$) is decreased and the amplification of the current-to-voltage converter means ($K_I$) is increased for decreasing the rated secondary current of a current transformer being tested.

Also according to the present invention, an adjustable electronic load for use in testing voltage transformers, comprises input voltage terminal ($U_1$, $U_2$) and input current terminals ($I_1$, $I_2$) adapted to be coupled to a transformer to be tested; current-to-voltage converter means ($K_U$) having an input coupled between input voltage terminals ($U_1$, $U_2$) of the electronic load, and further having an output; and controlled current generator means (G) having a control input and an output. A series connection of said input of said current-to-voltage converter means ($K_I$) and said output of said controlled current generator (G) is connected between input current terminals ($I_1$, $I_2$) of the electronic load. First impedance means ($Z\beta$) is provided for coupling the output of said current-to-voltage converter means ($K_I$) to said control input of said controlled current generator means (G); and second impedance means (R) is provided for coupling the output of said voltage-to-voltage converter means ($K_U$) to said control input of said controlled voltage generator means (G); said voltage-to-voltage converter means ($K_U$) and said current-to-voltage converter means ($K_I$) each comprising at least one respective adjustable amplifier having an adjustable amplification factor. An adjusting means is coupled to said adjustable amplifiers of said voltage-to-voltage converter means ($K_U$) and of said current-to-voltage converter means ($K_I$) for adjusting said amplification factors of said adjustable amplifiers jointly in opposite directions such that the amplification factor of one of said adjustable amplifiers increases while the amplification factor of the other of said adjustable amplifiers decreases and vice versa, so that with a given rated secondary power of a voltage transformer being tested, the amplification of said current-to-voltage converter means ($K_I$) is increased and the amplification of said voltage-to-voltage converter means ($K_U$) is decreased for increasing the rated secondary voltage of a voltage transformer being tested, and the amplification of the voltage-to-voltage converter means ($K_U$) is increased and the amplification of the current-to-voltage converter means ($K_I$) is decreased for decreasing the rated secondary voltage of a voltage transformer being tested.

BRIEF DESCRIPTION OF THE DRAWINGS

The invention and further developments thereof will now be described in detail on the basis of embodiments shown in the drawings in which.

DETAILED DESCRIPTION

Figure 1:
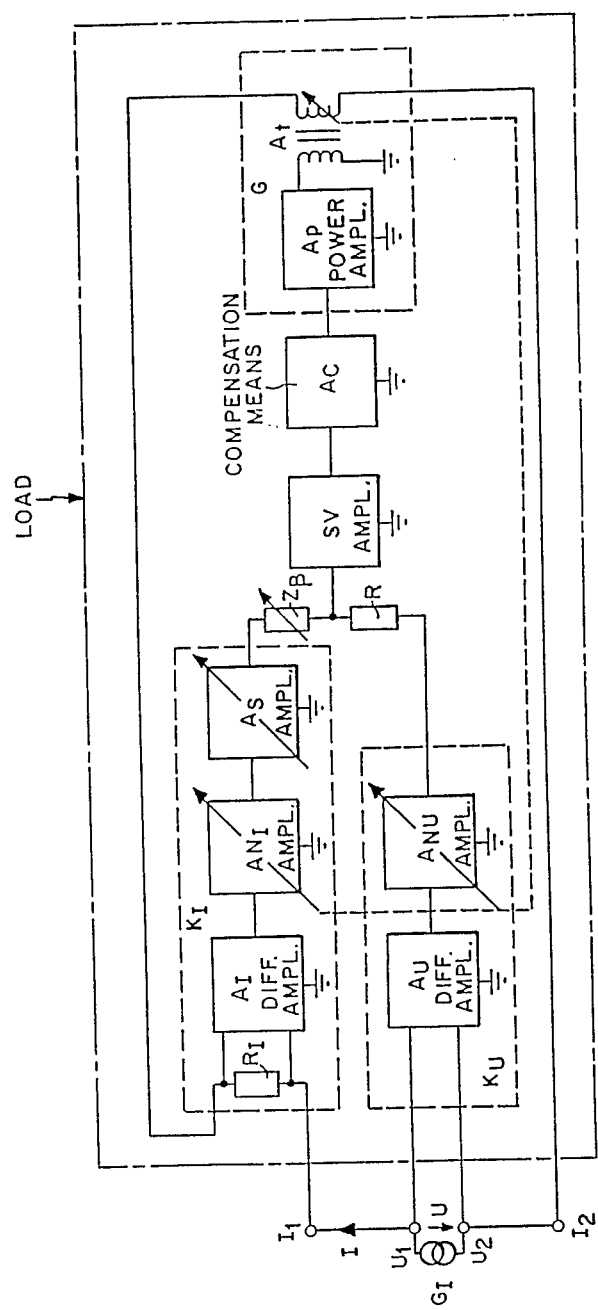
FIG. 1 shows an adjustable electronic load for use in testing a current transformer.

The embodiment illustrated in FIG. 1 is an adjustable electronic load for use in testing a current transformer. The load comprises two input voltage terminals $U_1, U_2$ and two input current terminals $I_1, I_2$. The inputs of a differential amplifier $A_U$ having a high input resistance are connected between the input voltage terminals $U_1, U_2$. To the output of differential amplifier $A_U$, there is connected an amplifier $A_{NU}$ with adjustable amplification factor.

Between the input current terminals $I_1, I_2$, there is connected a series connection including a current-sensing resistor $R_I$ and the secondary winding of a voltage transformer $A_t$. The two inputs of a differential amplifier $A_I$ of high input resistance are connected respectively to the two terminals of the resistor $R_I$. The output of differential amplifier $A_I$ is connected to an amplifier $A_{NI}$ with adjustable amplification factor. To the output of amplifier $A_{NI}$ there is connected a further amplifier $A_S$ with adjustable amplification factor.

An adjustable impedance $Z_\beta$ is connected to the output of the adjustable amplifier $A_S$, whereas an impedance R is connected to the output of amplifier $A_{NU}$. These two impedances $Z_\beta$ and R have their other ends connected to each other, and also connected to the input of an amplifier SV. The output of said amplifier SV is connected to a compensation means $A_C$, the output of which is coupled to a power amplifier $A_p$. The primary winding of the voltage transformer $A_t$ is connected to the output of power amplifier $A_p$. The transfer ratio of the voltage transformer $A_t$ is adjustable, in case of the embodiment shown, on the secondary side.

The adjustments of the amplification factor of the amplifier $A_{NI}$, the amplification factor of the amplifier $A_{NU}$ and of the transfer ratio of the voltage transformer $A_t$ are effected in common In doing so, the adjustment of the amplification factor of amplifiers $A_{NI}$ and $A_{NU}$ is effected in opposite directions. The adjustment of the amplification factor of amplifier $A_{NU}$ and of the transfer ratio of transformer $A_t$ is also effected in opposite directions. The adjustment of the amplification factor of amplifier $A_S$ preferably takes place independently of the common adjustment of amplifiers $A_{NI}$ and $A_{NU}$ and transformer $A_t$. The impedance $Z_\beta$ preferably is adjustable as well, independently of the adjustments of amplifiers $A_S$, $A_{NI}$ and $A_{NU}$ and transformer $A_t$.

In the above-described circuit of FIG. 1, the current-sensing resistor $R_I$ and the amplifiers $A_t$, $A_{NI}$ and $A_s$ constitute a current-to-voltage converter $K_I$. The amplifiers $A_U$ and $A_{NU}$ constitute a voltage-to-voltage converter $K_U$. The power amplifier $A_P$ constitutes together with the voltage transformer $A_t$ a controlled voltage generator G.

The operation of the current transformer load of FIG. 1 will now be described.

FIG. 1 shows coupled between the input voltage terminals $U_1$, $U_2$ a current source $G_I$ representing the secondary side of a current transformer to be tested. A voltage U dependent on the secondary current of the current transformer to be tested is impressed by the load on the secondary side of said current transformer. The voltage U is converted by the voltage-to-voltage converter $K_U$ into a voltage $k_u \times U$, with $k_u$ being the conversion factor of the voltage-to-voltage converter $K_U$. The current I is measured by means of the measuring resistor $R_I$. The current I is converted by the current-to-voltage converter $K_I$ into a voltage $k_i \times I$, with $k_i$ being the conversion factor of the current-to-voltage converter $K_I$.

The voltages appearing at the outputs of converters $K_I$ and $K_U$ are compared with each other by means of the impedances $Z_\beta$ and R. In the balanced state of the load, a practically virtual ground potential occurs at the connecting point between impedances $Z_\beta$ and R. In the balanced state, a voltage corresponding to the desired load value appears at the output of the power amplifier $A_P$.

As seen from the secondary side of the current transformer being tested, the load has an impedance $$Z_\beta = \frac{U}{I} = \frac{k_i}{k_u} \times \frac{R}{Z} \quad (1)$$

In equation (1), $Z_\beta$ is the impedance of the load.

When employing the amplifications of the amplifiers of converters $K_I$ and $K_U$, the following load impedance results:

$$Z_\beta = R_I \times \frac{a_i}{a_u} \times R \times \frac{a_{ni}}{a_{nu}} \times \frac{a_s}{Z} \quad (2)$$

In this equation, $a_i$, $a_u$, $a_{ni}$, $a_{nu}$ and $a_s$ are the amplification factors of the amplifiers $A_I$, $A_U$, $A_{NI}$, $A_{NU}$ and $A_S$, respectively.

The first three terms of equation (2) are preferably constant. That is, resistor $R_I$ is constant and the amplification factors of amplifiers $A_I$ and $A_U$ are constant. An influence on the load impedance is possible via the quantities of the last two terms of equation (2).

The adjustability of the amplification factors of amplifiers $A_{NI}$, $A_{NU}$, $A_S$ and the adjustability of impedance $Z_\beta$ provide the possibility of selecting the rated secondary power $S_N$, the power factor $\cos\beta$ and the rated secondary current $I_N$ as a function of the adjustments of these circuit components, as shown in the following equations (3 to 5).

$$S_N = f(a_s) \tag{3}$$

$$\cos\beta = f(Z_\beta) \tag{4}$$

$$I_N = f\left(\frac{a_{nu}}{a_{ni}}\right) \tag{5}$$

The preceding statements illustrate the advantages of the solution according to the invention, namely that the rated secondary power, the power factor cos and the rated secondary current are adjustable independently of each other.

The compensation means $A_C$ between the amplifier SV and the power amplifier $A_P$ serves for stabilizing the control system.

Figure 2:
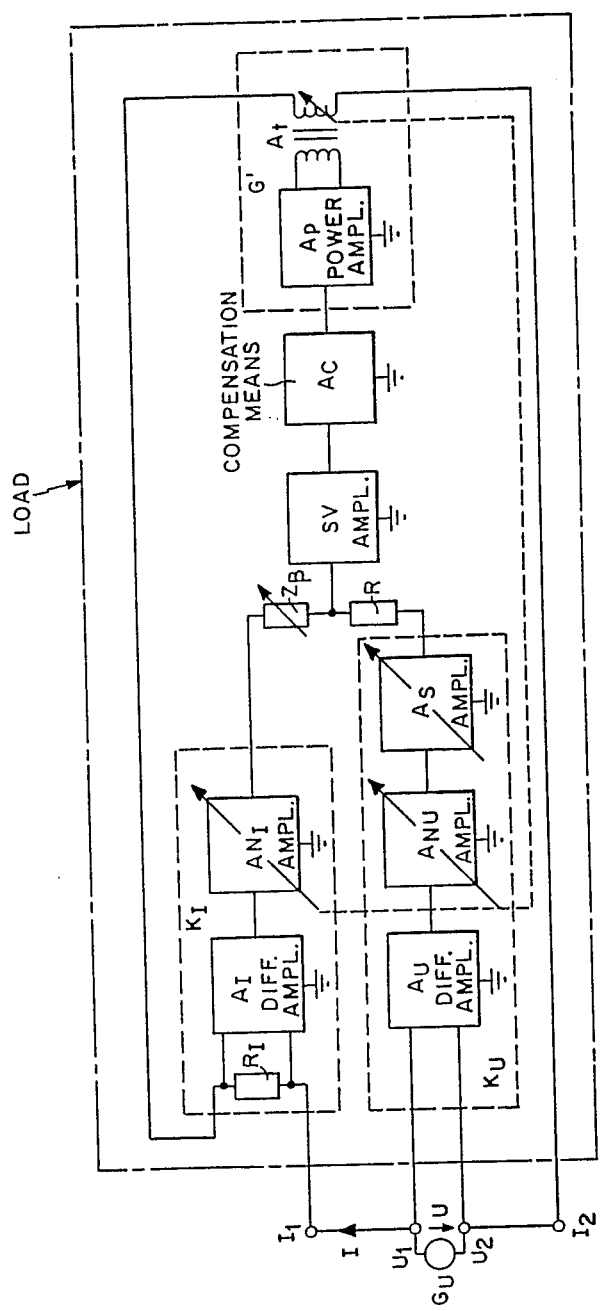
FIG. 2 shows an adjustable electronic load for use in testing a voltage transformer.

FIG. 2 illustrates an embodiment of an electronic load for measuring or testing a voltage transformer. In the following description of FIG. 2, components corresponding to circuit components of the current transformer load shown in FIG. 1 are designated with the same reference characters.

The voltage transformer load shown in FIG. 2 displays the following differences from the current transformer load shown in FIG. 1:

1. The voltage transformer connected to the load acts as a voltage source $G_U$ for the load;
2. The amplifier $A_S$ with a variable amplification factor is provided in the case of FIG. 2 in the voltage-to-voltage converter $K_U$;
3. The generator $G'$ on the output side is a controlled current generator; and
4. The transformer $A_t$ at the output of the controlled current generator $G'$ is a current transformer.

As regards the further circuit components thereof, the load for a voltage transformer according to FIG. 2 corresponds to the current transformer load according to FIG. 1, so that these circuit components need not be described again.

Below is a description of the mode of operation of the voltage transformer load of FIG. 2 with respect to those points in which it differs from the mode of operation of the current transformer load of FIG. 1.

The voltage transformer load according to FIG. 2 has a load impedance $Z_\beta$ corresponding to equation (1) given above. In view of the fact that in the case of the voltage transformer load the adjustable amplifier $A_S$ is not located in the current-to-voltage converter $K_i$ but in the voltage-to-voltage converter $K_U$, an expression differing from equation (2) results for the load impedance, $Z_\beta$ as follows:

$$Z_\beta = R_I \times \frac{a_i}{a_u} \times R \times \frac{a_{ni}}{a_{nu}} \times \frac{1}{Z \times a_s} \tag{6}$$

It follows from equation (6) that the rated secondary power, the power factor $\cos\beta$ and the rated secondary voltage $U_N$ are adjustable independently of each other as a function of the amplification factor $a_s$, the impedance $Z_\beta$ and the expression $a_{ni}/a_{nu}$ respectively, as it is indicated in the following equations (7 to 9). Equations (7) and (8) are identical with equations (3) and (4).

$$S_N = f(a_s) \tag{7}$$

$$\cos\beta = f(Z) \tag{8}$$

$$U_N = f\left(\frac{a_{ni}}{a_{nu}}\right) \tag{9}$$

Figure 3:
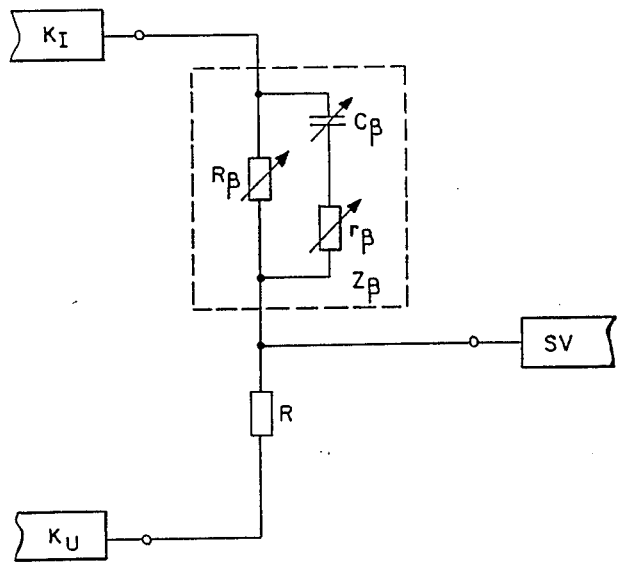
FIG. 3 shows an example of the impedance $Z_\beta$ and R in FIGS. 1 and 2.

An example of the constituents of the impedance $Z_\beta$ and R is shown in FIG. 3. Impedance $Z_\beta$ comprises, for example, an adjustable resistor $R_\beta$ coupled in parallel with a series connection of an adjustable capacitor $C_\beta$ and an adjustable resistor $r_\beta$. In a preferred embodiment, the adjustable components of $Z_\beta$ are programmable components. They are adjustable or programmable such that $|Z_\beta|=$ constant, and only the phase angle of impedance $Z_\beta$ is changeable for changing the power factor $\cos\beta$. In other words, $Z_\beta$ is adjustable such that only the power factor $\cos\beta$ is changed but the apparent power is maintained constant.

Figure 4:
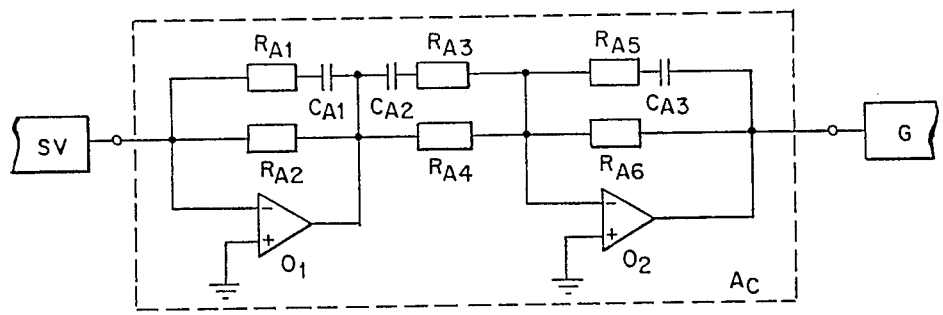
FIG. 4 shows an example of compensation means AC in FIGS. 1 and 2.

FIG. 4 shows an example of the compensation means $A_C$ of FIGS. 1 and 2. Compensation means $A_C$ comprises, for example of the compensation two operational amplifiers $O_1$ and $O_2$, the non-inverting inputs of which are connected to ground. The inverting input of operational amplifier $O_1$ is connected to the output of summing amplifier SV. The output of operational amplifier $O_2$ is connected to the input of the controlled voltage generator G or controlled current generator $G'$. The compensation means $A_C$ further comprises a parallel connection having a first series connection comprising resistors $R_{A2}$, $R_{A4}$ and $R_{A6}$, and a second series connection comprising a resistor $R_{A1}$, a capacitor $C_{A1}$, a capacitor $C_{A2}$, a resistor $R_{A3}$, a resistor $R_{A5}$ and a capacitor $C_{A3}$. The junction between capacitors $C_{A1}$ and $C_{A2}$ is connected to the junction between resistors $R_{A2}$ and $R_{A4}$. The junction between resistors $R_{A3}$ and $R_{A5}$ is connected to the junction between resistors $R_{A4}$ and $R_{A6}$. The junction between resistors $R_{A1}$ and $R_{A2}$ is connected to the inverting input of operational amplifier $O_1$. The inverting input of operational amplifier $O_2$ is connected to the junction of resistors $R_{A5}$ and $R_{A6}$. The output of operational amplifier $O_2$ is also connected to the junction of capacitor $C_{A3}$ and resistor $R_{A6}$.

The purpose of compensating means $A_C$ is to realize the desired frequency response of the loop gain in order to obtain a stable electronic load.

Figure 5:
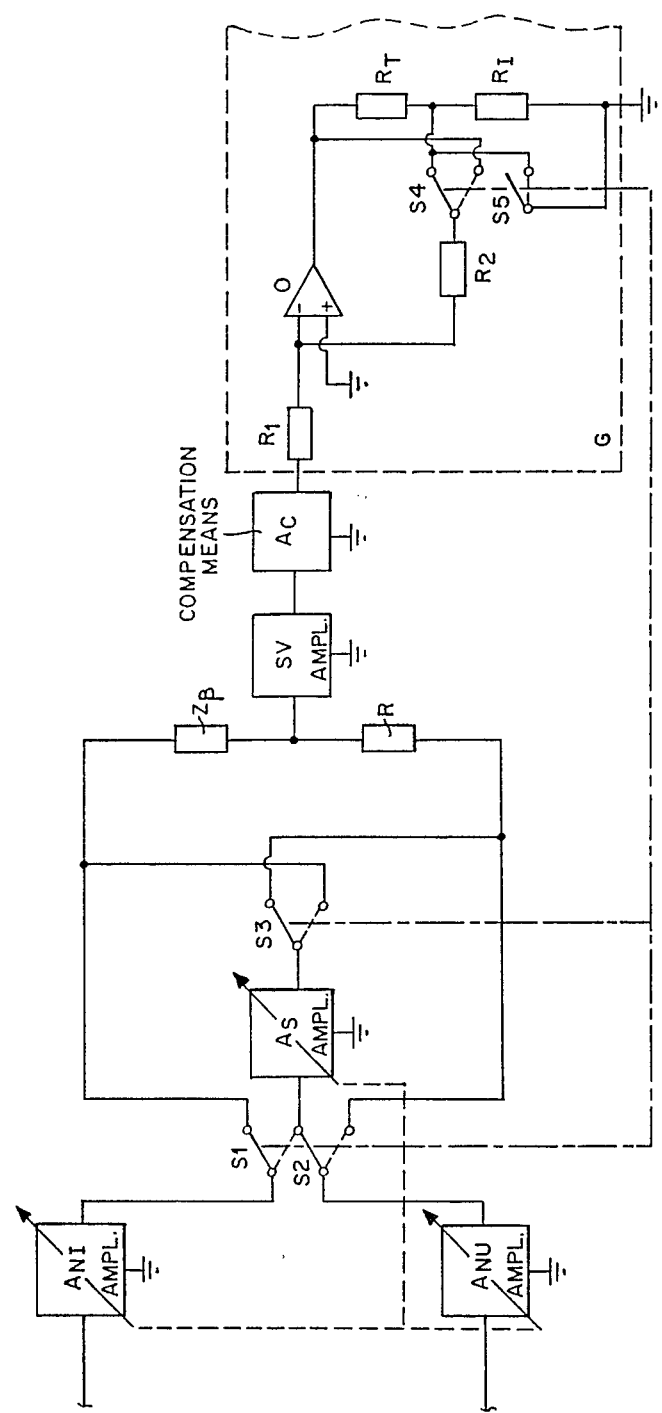
FIG. 5 shows a part of an adjustable electronic load which is switchable for selectively testing a current transformer or a voltage transformer.

FIG. 5 shows a part of a universal electronic load which is switchable so it can be used for testing a current transformer as well as for a voltage transformer. For that purpose, the input of adjustable amplifier $A_S$ is connected to the output of amplifier $A_{NI}$ and to the output of adjustable amplifier $A_{NU}$ by means of switches $S_1$ and $S_2$, respectively. The output of amplifier $A_S$ is connected to the input of impedance $Z_\beta$ as well as to the input of impedance R by means of a switch $S_3$. Switches $S_1$ to $S_3$ are commonly switched so that all of them take the position shown in FIG. 5 by the straight-line contact or the position shown in FIG. 5 by the dashed-line contact.

FIG. 5 shows an example of constituents for only a part of generator G,$G'$ which includes the power amplifier $A_p$ and the transformer $A_t$. In FIG. 5, resistor $R_T$ represents the primary winding of transformer former $A_t$ whereas the secondary winding of transformer $A_t$ is not shown.

Power amplifier $A_P$ comprises an operational amplifier O, the inverting input of which is connected to the output of compensation means $A_C$ through a resistor $R_1$. The non-inverting input of operational amplifier O is connected to ground. The output of operational amplifier O is connected to one terminal of resistor $R_T$. The other terminal of resistor $R_T$ is connected to ground through a current sensing resistor $R_I$. The non-inverting input of operational amplifier O is connected to a switch $S_4$ through a resistor $R_2$. The movable contact of switch $S_4$ connects resistor $R_2$ either to the output of operational amplifier O or to the common connection between resistors $R_T$ and $R_I$. Current sensing resistor $R_I$ is shunted by a switch $S_5$ which in its closed position short-circuits resistor $R_I$.

Switches $S_4$ and $S_5$ are commonly switchable together with switches $S_1$ to $S_3$ such that the movable contacts of all of the switches $S_1$ to $S_5$ have the positions shown by straight-lines in FIG. 5 or the positions shown by dashed lines in FIG. 5.

In the straight-line positions of switches $S_1$ to $S_5$, the electronic load can be used for testing a voltage transformer. Adjustable amplifier $A_S$ is switched between the output of amplifier $A_{NU}$ and the input terminal of impedance R whereas the output of amplifier $A_{NI}$ is directly connected to the input terminal of impedance $Z_\beta$. The power amplifier $A_P$ of generator G comprises a current feedback by sensing the output occurring through current sensing resistor $R_I$ and feeding it back to the inverting input of operational amplifier O by means of resistor $R_2$. Therefore, generator G behaves as a current generator. Therefore, FIG. 5 behaves as FIG. 2 if the movable contacts of switches $S_1$ to $S_5$ are in the positions shown by straight-lines in FIG. 5.

If switches $S_1$ to $S_5$ are in the positions shown by dashed-lines in FIG. 5, adjustable amplifier $A_S$ is connected between the output of amplifier $A_{NI}$ and the input terminal of impedance $Z_\beta$, whereas the output of amplifier $A_{NU}$ is directly connected to the input terminal of resistor R. The right-hand terminal of resistor $R_2$ is connected to the output of operational amplifier O whereas current sensing resistor $R_I$ is short circuited by means of switch $S_5$. Therefore, the power amplifier $A_P$ of generator G, having voltage feedback through resistor $R_2$, behaves as a voltage generator. Consequently, the electronic load shown in FIG. 5 behaves as the load shown in FIG. 1, i.e., as a load for a current transformer, when the switches $S_1$ to $S_5$ are in the positions shown by dashed-lines in FIG. 5.

From the above, it is seen that the load according to FIG. 5 can be used for a current transformer or for a voltage transformer by commonly switching over switches $S_1$ to $S_5$.

By using amplifiers with adjustable amplification, it has been rendered possible, with a fixed adjustment of the impedances connected upstream of the voltage generator G or current generator G' respectively, to vary the rated secondary current or the rated secondary voltage respectively, without influencing the adjusted rated power. Due to the fact that both the current-to-voltage converter branch $K_I$ and the voltage-to-voltage converter branch $I_U$ utilize an adjustable amplifier ($A_I$ and $A_U$) whose amplifications are changed in opposite directions, i.e., an amplification increase in one amplifier takes place in conjunction with an amplification decrease in the other amplifier and vice versa, it is possible to employ amplifiers each of which need to have only a relatively small variable amplification range. One thus avoids dynamic and noise problems which occur when an adjustable amplifier was used either only in the current-to-voltage converter branch or only in the voltage-to-voltage converter branch, which then would have to have a correspondingly great variable amplification range.

Preferably, there is provided an additional amplifier $A_S$ with an adjustable amplification factor which, in case of the load for a current transformer is provided in the current-to-voltage converter branch, and in case of the load for a voltage transformer is provided in the voltage-to-voltage converter branch. By adjustment of this additional adjustable amplifier $A_S$ it is possible to adjust the required rated or nominal power and, moreover, the fractions of the rated power corresponding to the test specifications. It is then possible to use fixed impedances for impedances connected upstream of the controllable voltage (G) or current (G') generator, respectively. Thus, with the illustrated embodiments, it is no longer necessary to provide any adjustable impedance networks whatsoever. It is technically considerably easier to realize an amplifier with an adjustable amplification factor than an impedance network the is adjustable to many different stages.

According to another feature of the invention, the controlled voltage generator or current generator may be provided at the output thereof with a voltage or, respectively, current transformer with adjustable transfer ratio, said transfer ratio being adjustable together with the amplification of the voltage-to-voltage converter or of the current-to-voltage converter respectively, with these adjustments being made in opposite directions. This means that, in the case of a load for testing a current transformer the transfer ratio of the voltage transformer decreases while the amplification of the voltage-to-voltage converter increases and vice versa, and that in the case of a load for testing a voltage transformer, the transfer ratio of the current transformer decreases while the amplification of the current-to-voltage converter increases and vice versa. By employing this voltage transformer or this current transformer, respectively, an ungrounded output is obtained, so that the current transformer or voltage transformer, respectively, can be grounded at the prescribed point. Due to the adjustability of the transfer ratio of the voltage transformer and the current transformer, one obtains a power adaptation to the feeding power amplifier at the given rated secondary current and the given rated secondary voltage, respectively. Due to the fact that the change of the transfer ratio is effected in the opposite direction to the change of the amplification of the voltage-to-voltage converter and the current-to-voltage converter respectively, it is possible to achieve a uniform loop amplification and thus stability of the entire control system.

When differential amplifiers ($A_I$ and $A_U$) of high input impedance are employed, load errors and measurement errors are avoided. It is very difficult to realize such differential amplifiers of high input impedance with a variable amplification factor. It is therefore preferred to arrange the adjustable amplifiers downstream of the high input impedance differential amplifiers.

A universal load that may be employed for testing both current transformers and voltage transformers is particularly advantageous. The technical expenditure for such a universal electronic load becomes particularly low when the second adjustable amplifier $A_S$ is adapted to be selectively switched into the current-to-voltage converter $K_I$ or into the voltage-to-voltage converter $K_U$ and when it is possible, furthermore, to switch from controlled voltage generator G to controlled current generator G'.

The input current terminals $I_1$, $I_2$ may be connected to the corresponding input voltage terminals $U_1$, $U_2$, respectively, or may be made to be identical therewith, when the voltage drops on the connecting lines between the measuring transformer and the load current terminals are negligibly low.

While the invention has been described above with respect to specific implementations, it should be clear that various modifications and alterations can be made within the scope of the appended claims.

I claim:

1. An adjustable electronic load for use in testing current transformers, comprising:
   input voltage terminals ($U_1$, $U_2$) and input current terminals ($I_1$, $I_2$) adapted to be coupled to a transformer to be tested;
   current-to-voltage converter means ($K_I$) having an input and an output;
   voltage-to-voltage converter means ($K_U$) having an input coupled between input voltage terminals ($U_1$, $U_2$) of the electronic load, and further having an output;
   controlled voltage generator means (G) having a control input and an output;
   a series connection of said input of said current-to-voltage converter means ($K_I$) and said output of said controlled voltage generator (G) being connected between input current terminals ($I_1$, $I_2$) of the electronic load;
   first impedance means ($Z_\beta$) coupling the output of said current-to-voltage converter means ($K_I$) to said control input of said controlled voltage generator means (G);
   second impedance means (R) coupling the output of said voltage-to-voltage converter means ($K_U$) to said control input of said controlled voltage generator means (G);
   said voltage-to-voltage converter means ($K_U$) and said current-to-voltage converter means ($K_I$) each comprising at least one respective adjustable amplifier having an adjustable amplification factor;
   adjusting means coupled to said adjustable amplifiers of said voltage-to-voltage converter means ($K_U$) and of said current-to-voltage converter means ($K_I$) for adjusting said amplification factors of said adjustable amplifiers jointly in opposite directions such that the amplification factor of one of said adjustable amplifiers increases while the amplification factor of the other of said adjustable amplifiers decreases and vice versa, so that with a given rated secondary power of a current transformer being tested, the amplification of said current-to-voltage converter means ($K_I$) is decreased and the amplification of said voltage-to-voltage converter means ($K_U$) is increased for increasing the rated secondary current of a current transformer being tested, and the amplification of the voltage-to-voltage converter means ($K_U$) is decreased and the amplification of the current-to-voltage converter means ($K_I$) is increased for decreasing the rated secondary current of a current transformer being tested.

2. The adjustable electronic load of claim 1, wherein said current-to-voltage converter means ($K_I$) comprises a second adjustable amplifier ($A_S$) having an amplification factor which is adjustable as a function of the desired rated secondary power of the transformer being tested.

3. The adjustable electronic load of claim 1, wherein:
   said controlled voltage generator means (G) is provided at its output with a voltage transformer ($A_t$) having an adjustable transfer ratio; and
   said transfer ratio and the amplification of said voltage-to-voltage converter means ($K_U$) are adjustable jointly in opposite directions such that the amplification of said voltage-to-voltage converter means ($K_U$) increases while the transfer ratio of said voltage transformer ($A_t$) decreases and vice versa.

4. The adjustable electronic load of claim 2, wherein:
   said controlled voltage generator means (G) is provided at its output with a voltage transformer ($A_t$) having an adjustable transfer ratio; and
   said transfer ratio and the amplification of said voltage-to-voltage converter means ($K_U$) are adjustable jointly in opposite directions such that the amplification of said voltage-to-voltage converter means ($K_U$) increases while the transfer ratio of said voltage transformer ($A_t$) decreases and vice versa.

5. The adjustable electronic load of claim 1, wherein said input current terminals ($I_1$, $I_2$) are each connected to a respective input voltage terminal ($U_1$, $U_2$).

6. The adjustable electronic load of claim 1, wherein said input current terminals ($I_1$, $I_2$) are the same as said input voltage terminals ($U_1$, $U_2$).

7. The adjustable electronic load of claim 2, wherein, for selective use of said electronic load with a current transformer or a voltage transformer, switching means is provided for selectively switching said second adjustable amplifier from said current-to-voltage converter means ($K_I$) into said voltage-to-voltage converter means ($K_U$) to permit testing of a voltage transformer.

8. The adjustable electronic load of claim 7, wherein said switching means further comprises means for switching said controlled voltage generator means (G) into a controlled current generator means (G') for testing of a voltage transformer.

9. The adjustable electronic load of claim 1, further comprising compensation means ($A_C$) coupling said first and second impedance means to said control input of said controlled voltage generator means for stabilizing said electronic load.

10. An adjustable electronic load for use in testing voltage transformers, comprising:
    input voltage terminals ($U_1$, $U_2$) and input current terminals ($I_1$, $I_2$) adapted to be coupled to a transformer to be tested;
    current-to-voltage converter means ($K_I$) having an input and an output;
    voltage-to-voltage converter means ($K_U$) having an input coupled between input voltage terminals ($U_1$, $U_2$) of the electronic load, and further having an output;
    controlled current generator means (G') having a control input and an output;
    a series connection of said input of said current-to-voltage converter means ($K_I$) and said output of said controlled current generator (G') being connected between input current terminals ($I_1$, $I_2$) of the electronic load;
    first impedance means ($Z_\beta$) coupling the output of said current-to-voltage converter means ($K_I$) to said control input of said controlled current generator means (G′);

second impedance means (R) coupling the output of said current-voltage converter means ($K_U$) to said control input of said controlled current generator means (G′);

second impedance means (R) coupling the output of said voltage-to-voltage converter means ($K_U$) to said control input of said controlled current generator means (G′);

said voltage-to-voltage converter means ($K_U$) and said current-to-voltage converter means ($K_I$) each comprising at least one respective adjustable amplifier having an adjustable amplification factor;

adjusting means coupled to said adjustable amplifiers of said voltage-to-voltage converter means ($K_U$) and of said current-to-voltage converter means ($K_I$) for adjusting said amplification factors of said adjustable amplifiers jointly in opposite directions such that the amplification factor of one of said adjustable amplifiers increases while the amplification factor of the other of said adjustable amplifiers decreases and vice versa, so that with a given rated secondary power of a voltage transformer being tested, the amplification of said amplification of said voltage-to-voltage converter means ($K_U$) is decreased for increasing the rated secondary voltage of a voltage transformer being tested, and the amplification of the voltage-to-voltage converter means ($K_U$) is increased and the amplification of the current-to-voltage converter means ($K_I$) is decreased for decreasing the rated secondary voltage of a voltage transformer being tested.

11. The adjustable electronic load of claim 10, wherein said voltage-to-voltage converter means ($K_U$) comprises a second adjustable amplifier ($A_S$) having an amplification factor which is adjustable as a function of the desired rated secondary power of the transformer being tested.

12. The adjustable electronic load of claim 10, wherein:

said controlled current generator means (G′) is provided at its output with a current transformer ($A_t$) having an adjustable transfer ratio; and said transfer ratio and the amplification of said current-to-voltage converter means ($K_I$) are adjustable jointly in opposite directions such that the amplification of said current-to-voltage converter means ($K_I$) increases while the transfer ratio of said voltage transformer ($A_t$) decreases and vice versa.

13. The adjustable electronic load of claim 11, wherein:

said controlled current generator means (G′) is provided at its output with a current transformer ($A_t$) having an adjustable transfer ratio; and said transfer ratio and the amplification of said current-to-voltage converter means ($K_I$) are adjustable jointly in opposite directions such that the amplification of said current-to-voltage converter means ($K_I$) increases while the transfer ratio of said voltage transformer ($A_t$) decreases and vice versa.

14. The adjustable electronic load of claim 10, wherein said input current terminals ($I_1$, $I_2$) are each connected to a respective input voltage terminal ($U_1$, $U_2$)

15. The adjustable electronic load of claim 10, wherein said input current terminals ($I_1$, $I_2$) are the same as said input voltage terminals ($U_1$, $U_2$).

16. The adjustable electronic load of claim 11, wherein, for selective use of said electronic load with a current transformer or a voltage transformer, switching means is provided for selectively switching said second adjustable amplifier from said voltage-to-voltage converter means ($K_U$) into said current-to-voltage converter means ($K_I$) to permit testing of a current transformer.

17. The adjustable electronic load of claim 16, wherein said switching means further comprises means for switching said controlled current generator means (G′) into a controlled voltage generator means (G) for testing of a current transformer.

18. The adjustable electronic load of claim 10, further comprising compensation means ($A_C$) coupling said first and second impedance means to said control input of said controlled current generator means for stabilizing said electronic load.

* * * * *